United States Patent
Kunitake et al.

(10) Patent No.: US 8,576,606 B2
(45) Date of Patent: Nov. 5, 2013

(54) NONVOLATILE SEMICONDUCTOR MEMORY DEVICE

(75) Inventors: Tetsuji Kunitake, Kuwana (JP);
Takashi Shigeoka, Fujisawa (JP);
Takayuki Tsukamoto, Yokkaichi (JP);
Hironori Wakai, Atsugi (JP); Hisashi Kato, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 13/052,214

(22) Filed: Mar. 21, 2011

(65) Prior Publication Data

US 2011/0235401 A1  Sep. 29, 2011

(30) Foreign Application Priority Data

Mar. 23, 2010 (JP) .................................. 2010-066429

(51) Int. Cl.
*G11C 11/00* (2006.01)

(52) U.S. Cl.
USPC .......................................... 365/148; 365/163

(58) Field of Classification Search
USPC .................................. 365/148, 163
See application file for complete search history.

(56) References Cited

U.S. PATENT DOCUMENTS 7,471,543 B2 * 12/2008 Nakashima et al. ........... 365/148
7,978,497 B2    7/2011 Maejima

FOREIGN PATENT DOCUMENTS

| JP | 2005-522045 | 7/2005 |
| JP | 2008-210441 | 9/2008 |
| JP | 2009-217908 A | 9/2009 |

OTHER PUBLICATIONS

Office Action issued Jul. 17, 2012 in Japanese Patent Application No. 2010-066429 (with English-language translation).

* cited by examiner

*Primary Examiner* — Huan Hoang
(74) *Attorney, Agent, or Firm* — Oblon, Spivak, McClelland, Maier & Neustadt, L.L.P.

(57) ABSTRACT

A nonvolatile semiconductor memory device according to an embodiment herein includes a memory cell array. The memory cell array includes memory cells each provided between a first line and a second line and each including a variable resistor. A control circuit applies through the first and second lines a voltage necessary for a forming operation of the memory cell. A current limiting circuit limits a value of a current flowing across the memory cell during the forming operation to a certain limit value. The control circuit repeats an operation of applying the voltage by setting the limit value to a certain value and an operation of changing the limit value from the certain value, until forming of the memory cell is achieved.

10 Claims, 16 Drawing Sheets

NONVOLATILE SEMICONDUCTOR MEMORY DEVICE

CROSS REFERENCE TO RELATED APPLICATIONS

This application is based on and claims the benefit of priority from prior Japanese Patent Application No. 2010-66429, filed on Mar. 23, 2010, the entire contents of which are incorporated herein by reference.

FIELD

Embodiments described herein relate generally to a nonvolatile semiconductor memory device.

BACKGROUND

In recent years, along with a rising level of integration in semiconductor devices, circuit patterns of transistors and the like which configure the semiconductor devices are being increasingly miniaturized. Required in this miniaturization of the patterns is not simply a thinning of line width but also an improvement in dimensional accuracy and positional accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor contributing to a rise in product cost.

In recent years, resistance varying memory is attracting attention as a candidate to succeed these kinds of semiconductor memory devices utilizing a MOSFET as a memory cell. For example, there is known a resistance change memory (ReRAM: Resistive RAM) that has a transition metal oxide as a recording layer and is configured to store a resistance state in a nonvolatile manner.

Write of data to a memory cell is implemented by applying for a short time to a variable resistor a certain setting voltage Vset. As a result, the variable resistor changes from a high-resistance state to a low-resistance state. Hereinafter, this operation to change the variable resistor from a high-resistance state to a low-resistance state is called a setting operation.

In contrast, erase of data in the memory cell MC is implemented by applying for a long time to the variable resistor in the low-resistance state subsequent to the setting operation a resetting voltage Vreset which is lower than the setting voltage Vset of a time of the setting operation. As a result, the variable resistor changes from the low-resistance state to the high-resistance state. Hereinafter, this operation to change the variable resistor from a low-resistance state to a high-resistance state is called a resetting operation. The memory cell, for example, has the high-resistance state as a stable state (a reset state), and, in the case of binary data storage, data write is implemented by the setting operation which changes the reset state to the low-resistance state.

In this kind of conventional resistance change memory, a margin between the setting voltage Vset and the resetting voltage Vreset is small. When the margin is small, there is a chance of a false operation such as a false resetting operation occurring, which is undesirable. Take the case, for example, where to implement the resetting operation for changing the variable resistor in the low-resistance state to the high-resistance state using the resetting voltage Vreset. In this case, while the variable resistor is in the low-resistance state, there is not a high voltage applied across the terminals of the variable resistor; however, the moment the variable resistor shifts to the high-resistance state, a voltage exceeding the setting voltage might be applied to the variable resistor. In such a case, a situation may arise in which the variable resistor once returned to the high-resistance state gets shifted back once again to the low-resistance state (false setting operation). Consequently, there is desired a memory cell that allows a large margin to be provided between the setting voltage and the resetting voltage.

Moreover, subsequent to patterning process of a memory cell structure of this kind of resistance change memory, it is necessary to execute a "forming operation" of applying to the memory cell structure a voltage which is greater than a writing voltage, in order to bring the memory cell structure to a state where it is usable as a memory cell, i.e., a state where it can change between the high-resistance state and the low-resistance state.

Depending on the conditions of voltage application in this forming operation, the resistance value of the memory cell after the forming operation is completed might become too low. If the resistance of the memory cell after the forming operation is completed becomes too low, the resistance value of the memory cell after a setting operation becomes even lower. As a result, an excessively high current will occur during an operation, leading to a problem that the power consumption becomes high.

DETAILED DESCRIPTION

A nonvolatile semiconductor memory device according to an embodiment described herein includes a memory cell array including—memory cells arranged therein. Each of the memory cells is provided between a first line and a second line and includes a variable resistor. A control circuit applies through the first and second lines a voltage necessary for a forming operation of a memory cell. A current limiting circuit limits a value of a current flowing across the memory cell during the forming operation to a certain limit value. The control circuit repeats an operation of applying the voltage while setting the limit value to a certain value and an operation of changing the limit value from the certain value, until forming of the memory cell is achieved.

Next, the embodiments of the present invention will be explained in detail with reference to the drawings.

[Overall Configuration]

Figure 1:
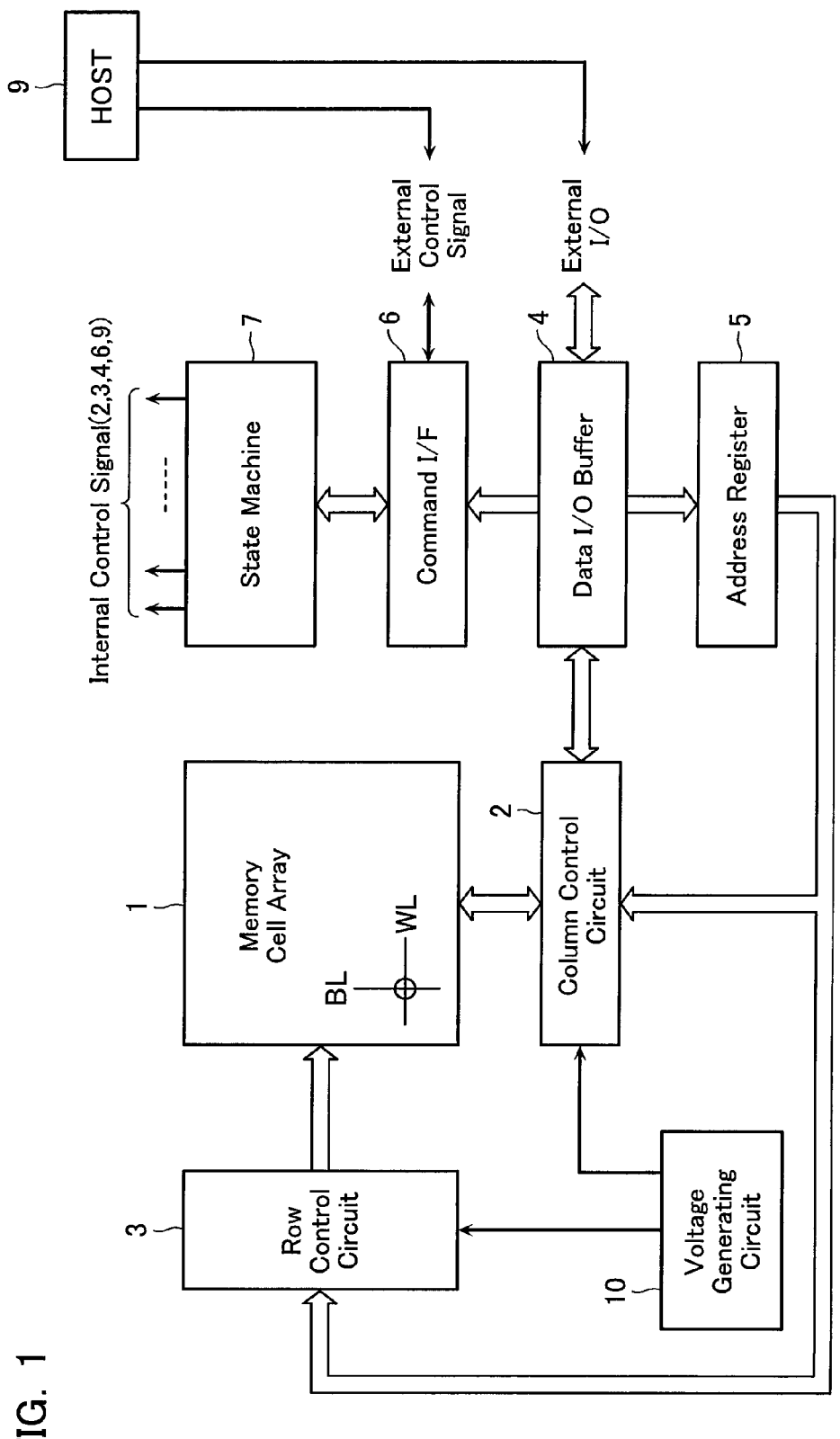
FIG. 1 is a block diagram of a nonvolatile semiconductor memory device according to a first embodiment of the present invention.

FIG. 1 is a block diagram of a nonvolatile memory according to a first embodiment of the present invention.

The nonvolatile memory includes a memory cell array 1 in which memory cells each using a ReRAM (variable resistor) described later are arranged in a matrix.

Provided at a position adjoining the memory cell array 1 in a bit line BL direction is a column control circuit 2 configured to control the bit lines BL of the memory cell array 1 and execute erasing of data from a memory cell, writing of data to a memory cell, and reading of data from a memory cell.

Provided at a position adjoining the memory cell array 1 in a word line WL direction is a row control circuit 3 configured to select a word line WL of the memory cell array 1 and apply voltages necessary for erasing of data from a memory cell, writing of data to a memory cell, and reading of data from a memory cell.

A data I/O buffer 4 is connected to an external host 9 via an I/O line, and receives write data and an erase instruction, outputs read data, and receives address data and command data. The data I/O buffer 4 sends received write data to the column control circuit 2, and receives read data from the column control circuit 2 to output it to the outside. An address supplied to the data I/O buffer 4 from the outside is sent to the column control circuit 2 and the row control circuit 3 via an address register 5.

A command supplied by the host 9 to the data I/O buffer 4 is sent to a command interface 6. The command interface 6 receives an external control signal from the host 9, determines whether data input in the data I/O buffer 4 is write data, a command, or an address, and when it is a command, transfers it as a received command signal to a state machine 7.

The state machine 7 manages the nonvolatile memory on the whole, receives a command from the host 9 via the command interface 6, and executes management of reading, writing, erasing, data I/O, etc.

The external host 9 can also receive status information managed by the state machine 7 and determine an operation result. The status information is also used for controlling writing and erasing.

A voltage generating circuit 10 is controlled by the state machine 7. Under this control, the voltage generating circuit 10 can output a pulse of an arbitrary voltage at an arbitrary timing.

The generated pulse can be transferred to an arbitrary line selected by the column control circuit 2 and the row control circuit 3. The peripheral circuit elements other than the memory cell array 1 can be formed on a Si substrate immediately under the memory cell array 1 formed in an interconnection layer, and hence the chip area of the nonvolatile memory can be substantially equal to the area of the memory cell array 1.

[Memory Cell Array and its Peripheral Circuits]

Figure 2:
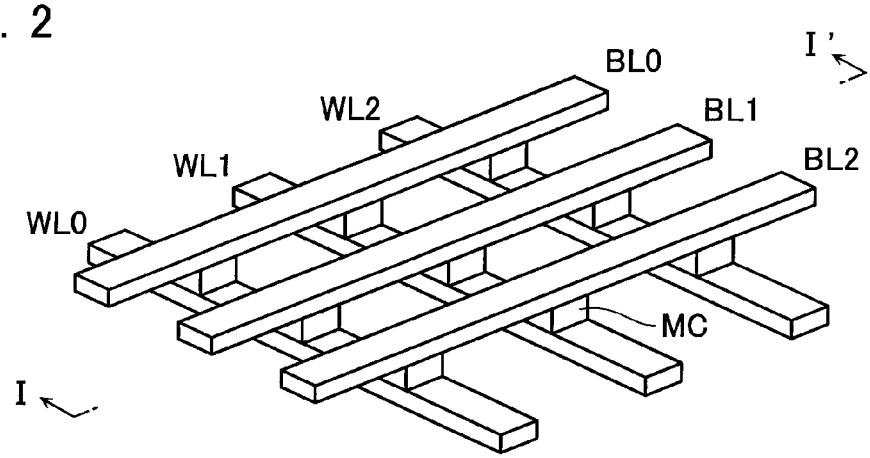
FIG. 2 is a perspective diagram of a portion of a memory cell array 1.
Figure 3:
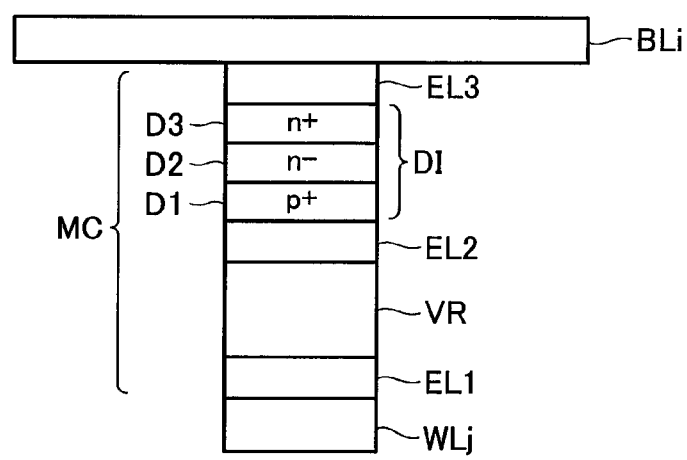
FIG. 3 is a cross-sectional diagram of FIG. 2 taken along a line I-I' and seen in the direction of arrow, showing one memory cell.

FIG. 2 is a perspective diagram of a portion of the memory cell array 1. FIG. 3 is cross-sectional diagram of FIG. 2 taken along a line I-I' and seen in the direction of arrow, showing one memory cell. There are provided parallel word lines WL0 to WL2 as a plurality of first lines, parallel bit lines BL0 to BL2 as a plurality of second lines intersecting the word lines, and memory cells MC each provided at the intersection of the word line and bit line to be sandwiched therebetween. It is preferable that the first and second lines be made of a heat-resistant material having a low resistance value, such as W, WSi, NiSi, CoSi, etc.

[Memory Cell MC]

As shown in FIG. 3, a memory cell MC is configured by a series circuit of a variable resistor VR and a rectifying element DI. The variable resistor VR can be made of, for example, carbon (C). Other than this, it may be made of a material having a resistance value which can change in response to voltage application. As shown in FIG. 3, for example, the rectifying element DI is configured by a PIN diode including a p+ type layer D1, an n− type layer D2, and an n+ type layer D3, and can be formed sandwiched between electrodes EL2 and EL3. The "+" and "−" signs indicate level difference of impurity concentration.

The electrode material of the electrodes EL1 to EL3 may be Pt, Au, Ag, TiAlN, SrRuO, Ru, RuN, Ir, Co, Ti, TiN, TaN, LaNiO, Al, PtIrOx, PtRhOx, Rh/TaAlN, W, etc. A metal film that provides uniform orientation may be inserted. A buffer layer, a barrier metal layer, an adhesive layer, etc. may also be inserted separately.

[Modified Example of Memory Cell Array]

Figure 4:
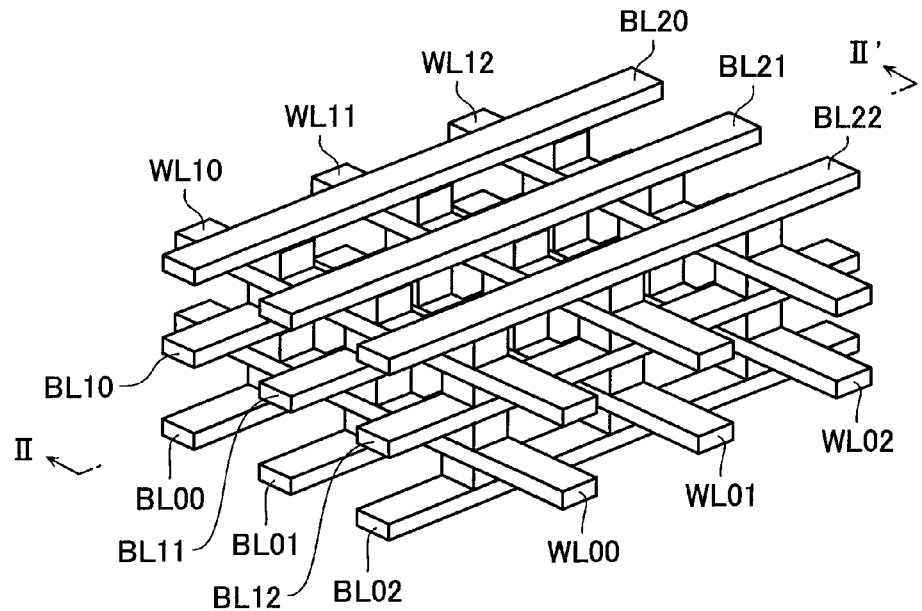
FIG. 4 shows another example of the configuration of the memory cell array 1.
Figure 5:
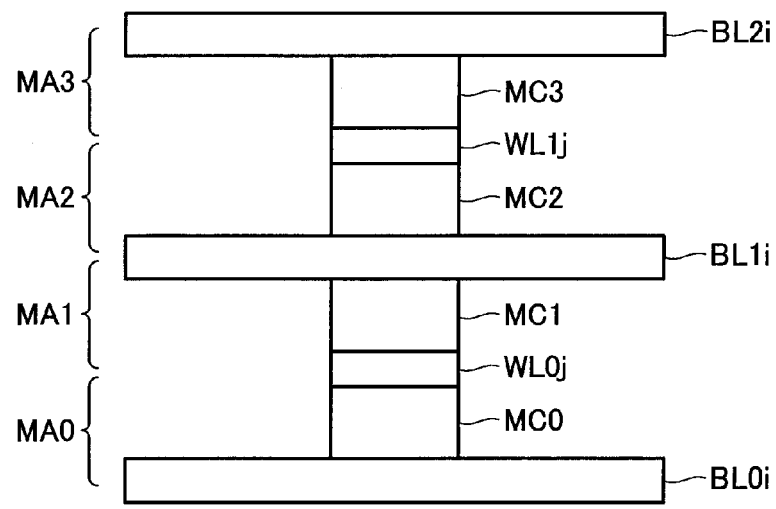
FIG. 5 shows another example of the configuration of the memory cell array 1.

As shown in FIG. 4, a three-dimensional configuration including the above-described memory configuration in plural layers is also available. FIG. 5 is a cross-sectional diagram of FIG. 4 taken along a line II-II'. The shown example is a four-layered memory cell array configured by cell array layers MA0 to MA3. A word line WL0j is shared by memory cells MC0 and MC1 above and below the word line WL0j. A bit line BL1i is shared by memory cells MC1 and MC2 above and below the bit line BL1i. A word line WL1j is shared by memory cells MC2 and MC3 above and below the word line WL1j.

The layered configuration needs not be a repetition of line/cell/line/cell described above, but may be a repetition of line/cell/line/interlayer insulating film/line/cell/line with an interlayer insulating film provided between the cell array layers. The memory cell array 1 may also be divided into some memory cell groups MAT. The column control circuit 2 and the row control circuit 3 described above may be provided per MAT, per sector, or per cell array layer MA, or may be shared by them. Alternatively, these circuits may be shared by a plurality of bit lines BL for the purpose of area reduction.

Figure 6:
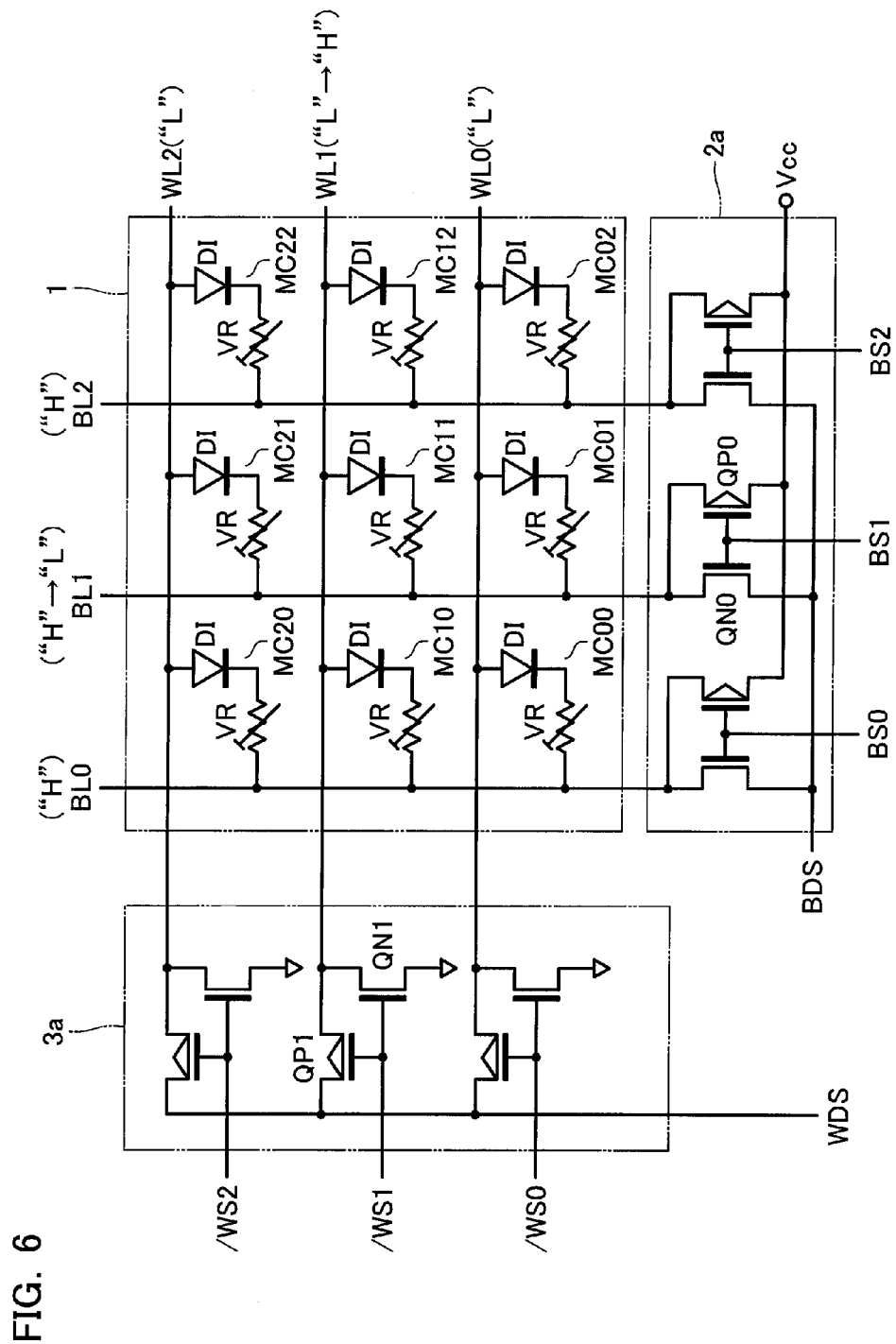
FIG. 6 is a circuit diagram of the memory cell array 1 and its peripheral circuits.

FIG. 6 is a circuit diagram of the memory cell array 1 and its peripheral circuits. In order to simplify the explanation, the following description assumes that the memory cell array 1 is a single-layered configuration. In FIG. 6, the rectifying element DI configuring a memory cell MC has its anode connected to a word line WL and its cathode connected to a bit line BL via the variable resistor VR. One end of each bit line BL is connected to a selecting circuit 2a configuring a part of the column control circuit 2. One end of each word line WL is connected to a selecting circuit 3a configuring a part of the row control circuit 3.

The selecting circuits 2a are each configured by a selecting PMOS transistor QP0 and a selecting NMOS transistor QN0 provided per bit line BL and having their gates and drains connected commonly. The sources of the selecting PMOS transistors QP0 are connected to a high-potential power supply Vcc. The sources of the selecting NMOS transistors QN0 are connected to a bit line-side drive sense line BDS for applying a writing pulse and flowing a current to be detected in a data reading operation. The transistors QP0 and QN0 have their common drain connected to a bit line BL, and their common gate supplied with a bit line selecting signal BSi for selecting each bit line BL.

The selecting circuits 3a are each configured by a selecting PMOS transistor QP1 and a selecting NMOS transistor QN1 provided per word line WL and having their gates and drains connected commonly. The sources of the selecting PMOS transistors QP1 are connected to a word line-side drive sense line WDS for applying a writing pulse and flowing a current to be detected in a data reading operation. The sources of the selecting NMOS transistors QN1 are connected to a low-potential power supply Vss. The transistors QP1 and QN1 have their common drain connected to a word line WL and their common gate supplied with a word line selecting signal /WSi for selecting each word line WL.

The foregoing description has shown an example suitable for when selecting the memory cells individually. When reading data from a plurality of memory cells MC connected to a selected word line WL1 simultaneously, the bit lines BL0 to BL2 are individually provided with sense amplifiers and individually connected to them via the selecting circuit 2a in response to the bit line selecting signal BS. In the memory cell array 1, the polarity of the rectifying element DI may be reversed from the polarity in the circuit of FIG. 6 (i.e., the rectifying element DI may be connected to have a forward direction from a bit line BL to a word line WL), such that a current may flow from a bit line BL side to a word line WL side.

Figure 7:
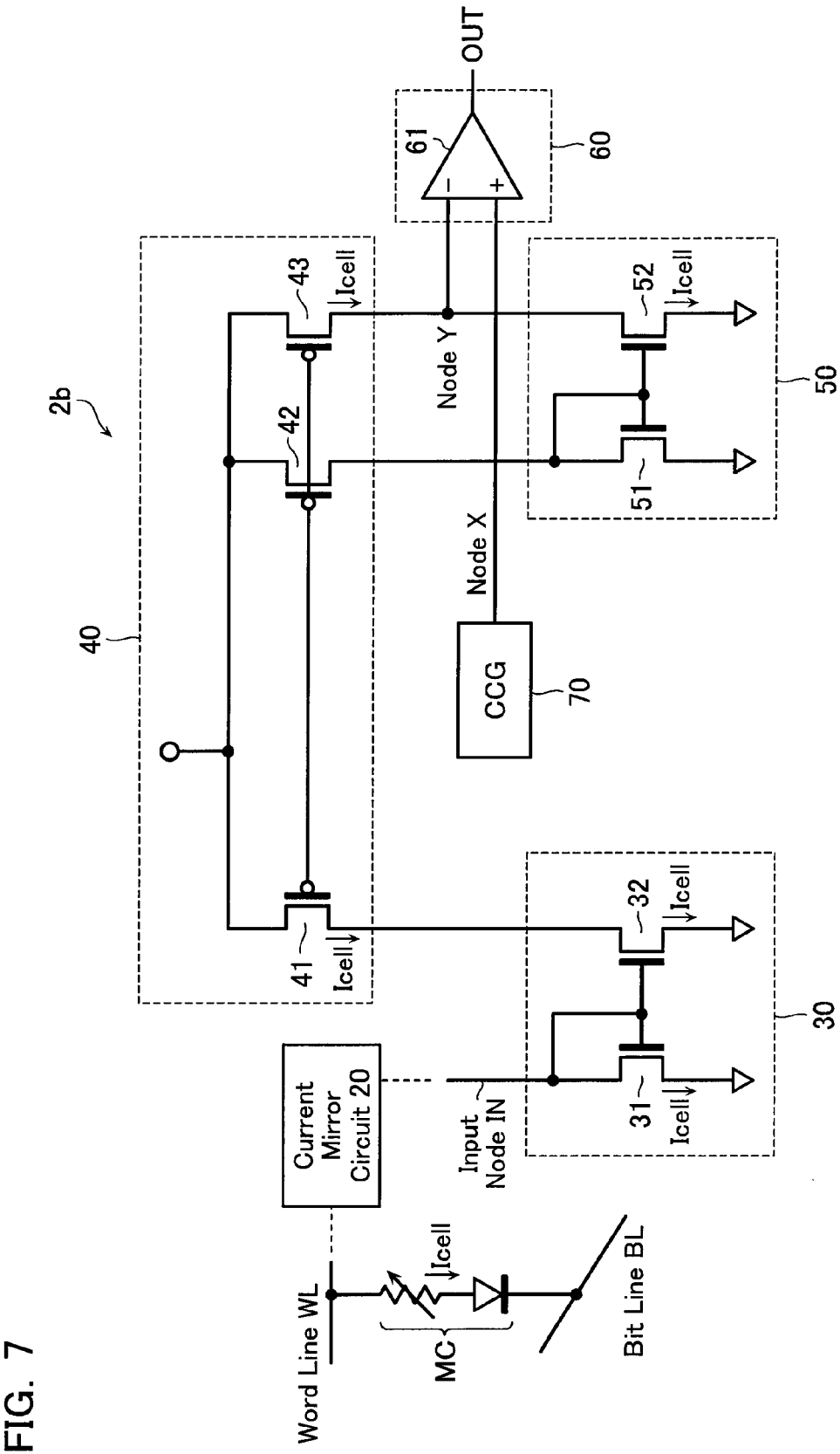
FIG. 7 is a circuit diagram showing a circuit configuration of a current limiting circuit 2b included in a column control circuit 2.

The column control circuit 2 includes a current limiting circuit 2b shown in FIG. 7 as a circuit for executing a forming operation. To explain the forming operation by taking a case of executing it by selecting the memory cells MC one by one for example, a forming voltage Vform for the forming operation is applied to the word line WL connected to a selected memory cell MC and the ground voltage Vss is applied to the bit line BL connected to the selected memory cell MC.

At this time, when a filament is formed in the variable resistor VR of the selected memory cell due to the forming voltage Vform, the resistance value of the variable resistor VR lowers.

The lowering of the resistance value is observed as a rise of a cell current Icell. Hence, the current limiting circuit 2b of FIG. 7 detects whether the cell current Icell has exceeded a limit current Icomp or not during the forming operation, and when it has exceeded, executes control of stopping application of the forming voltage Vform.

Hereinafter, the configuration of the current limiting circuit 2b will be explained with reference to FIG. 7. The current limiting circuit 2b includes a current mirror circuit 20, current mirror circuits 30, 40, and 50, a differential amplifier 60, and a limit current generating circuit 70.

The current mirror circuit 20 has a function of mirroring the current flowing across the memory cell MC and supplying it to the current mirror circuits 30, 40, and 50. The current mirror circuits 30 and 40 are configured by current-mirror-connected transistors 31 to 32 and current-mirror-connected transistors 41 to 43 respectively.

The limit current generating circuit 70 has a function of generating the limit current Icomp and causing a voltage corresponding to the generated limit current Icomp at a node X. The differential amplifier 60 differentially amplifies a voltage caused at a node Y based on the current Icell and the voltage of the node X and outputs an output signal OUT. The state machine 7 stops the supply of the forming voltage Vform to the memory cell MC in accordance with this output signal OUT.

Furthermore, the state machine 7 executes an operation of incrementing (i.e., stepping up) the limit current Icomp by a certain value $\Delta$I each time. The initial value Icomp1 of the limit current Icomp is set to a value insufficient for the forming to be achieved, in other words, to a value lower than the value of the limit current Icomp for when the forming is achieved. That is, the initial value Icomp1 should be set to such a value that the probability of the forming of the memory cell MC being achieved is next to zero when the initial value Icomp1 is set. After the limit current Icomp is stepped up, the forming voltage Vform is applied again. Afterwards, the operation of stepping up the limit current Icomp and the operation of applying the forming voltage Vform are repeated until it is determined that the forming of the selected memory cell MC is achieved.

Figure 8:
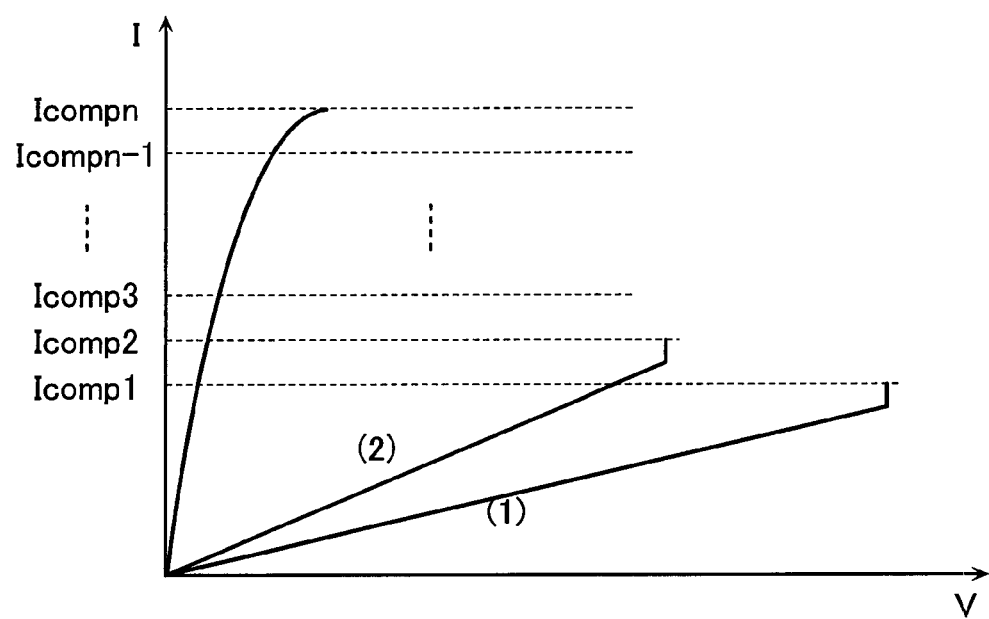
FIG. 8 is a graph showing an operation according to the first embodiment of the present invention.
Figure 9:
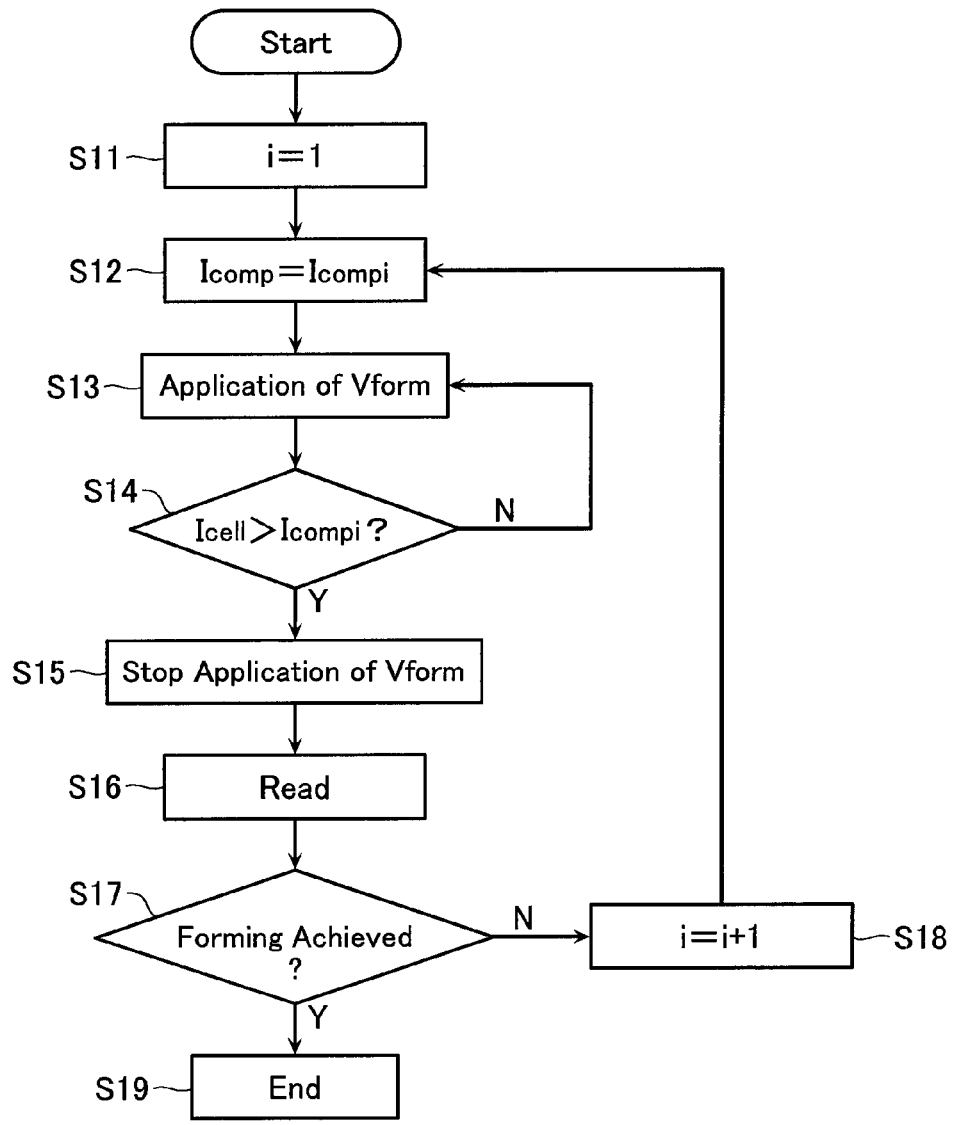
FIG. 9 is a flowchart showing an operation according to the first embodiment of the present invention.
Figure 10:
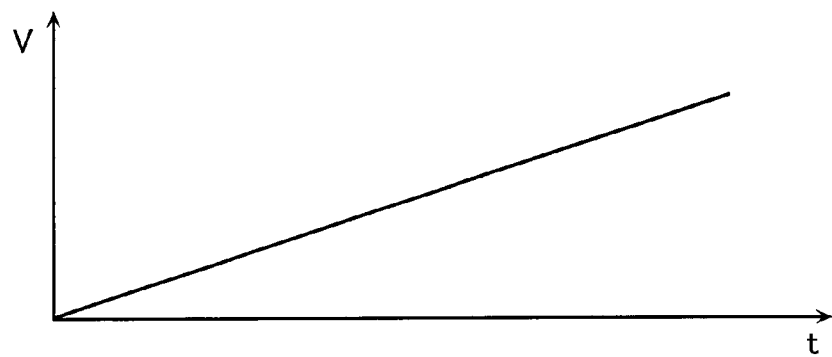
FIG. 10 is a graph showing an operation according to the first embodiment of the present invention.

A specific procedure of the forming operation will be explained with reference to the graph of FIG. 8 and the flowchart of FIG. 9. First, the limit current Icomp is set to the initial value Icomp1 (i=1) (steps S11, S12). In this condition, application of the forming voltage Vform is started (step S13). As shown in FIG. 10, the forming voltage Vform is supplied as a voltage of which voltage level rises continuously.

As the voltage level of the forming voltage Vform rises in this way, the cell current Icell flowing across the selected memory cell MC positioned at the intersection of the selected bit line BL and the selected word line WL also rises. The current limiting circuit 2b compares the cell current Icell with the limit current Icompi and determines whether the former has exceeded the latter or not (step S14). If it has not exceeded, the application of the forming voltage Vform is continued, and the voltage level of the forming voltage Vform rises gradually.

When the cell current Icell has exceeded the limit current Icompi, the operation of applying the forming voltage Vform is stopped (step S15). Then, the state machine 7 controls the column control circuit 2 and the row control circuit 3 to execute a reading operation in the selected memory cell MC (step S16). When it turns out as a result that the resistance value of the memory cell MC has become a certain value or lower, which means that the forming has been achieved, the forming operation is completed (steps S17, S19). To the contrary, when the resistance value of the memory cell MC is higher than the certain value, a limit current Icomp1+1 is set to replace the limit current Icompi. The limit current Icompi+1 is higher than the limit current Icompi by the step-up value Δi.

In this way, the forming operation is started again with the new limit value Icompi+1. This operation is repeated until it is determined in step S17 that the forming has been achieved.

As explained above, according to the semiconductor memory device of the present embodiment, the operation of applying the forming voltage Vform by setting the limit current Icomp to a certain value (e.g., Icompi) and the operation of stepping up the value of the limit current Icomp (to, e.g., Icompi+1) and applying the forming voltage Vform again by setting the stepped-up limit current Icomp are repeated until the forming is achieved. According to this procedure, the memory cell is prevented from being excessively lowered in resistance by the forming operation, and overall power consumption can hence be reduced. If, as described above, the initial value Icomp1 of the limit current Icomp is set to a value insufficient for the forming to be achieved, the possibility of the memory cell being excessively lowered in resistance can further be reduced.

As the case may be, the limit current Icomp may be kept at the same value, instead of being stepped up. Also in the following explanation, when it is described that "the value of the limit current Icomp is stepped up", this is meant to include the case that the step-up width is zero and hence the value remains unchanged.

[Second Embodiment]

Figure 11:
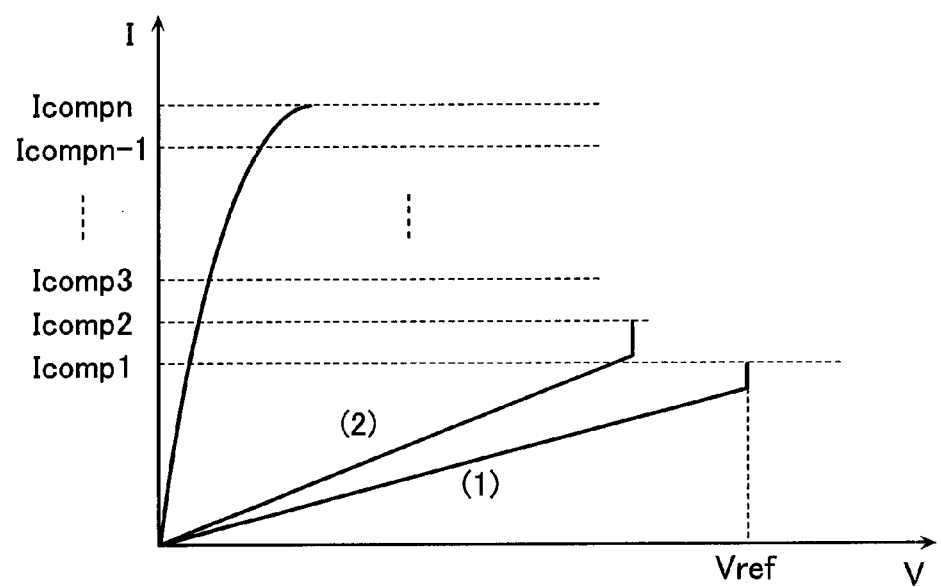
FIG. 11 is a graph showing an operation according to a second embodiment of the present invention.
Figure 12:
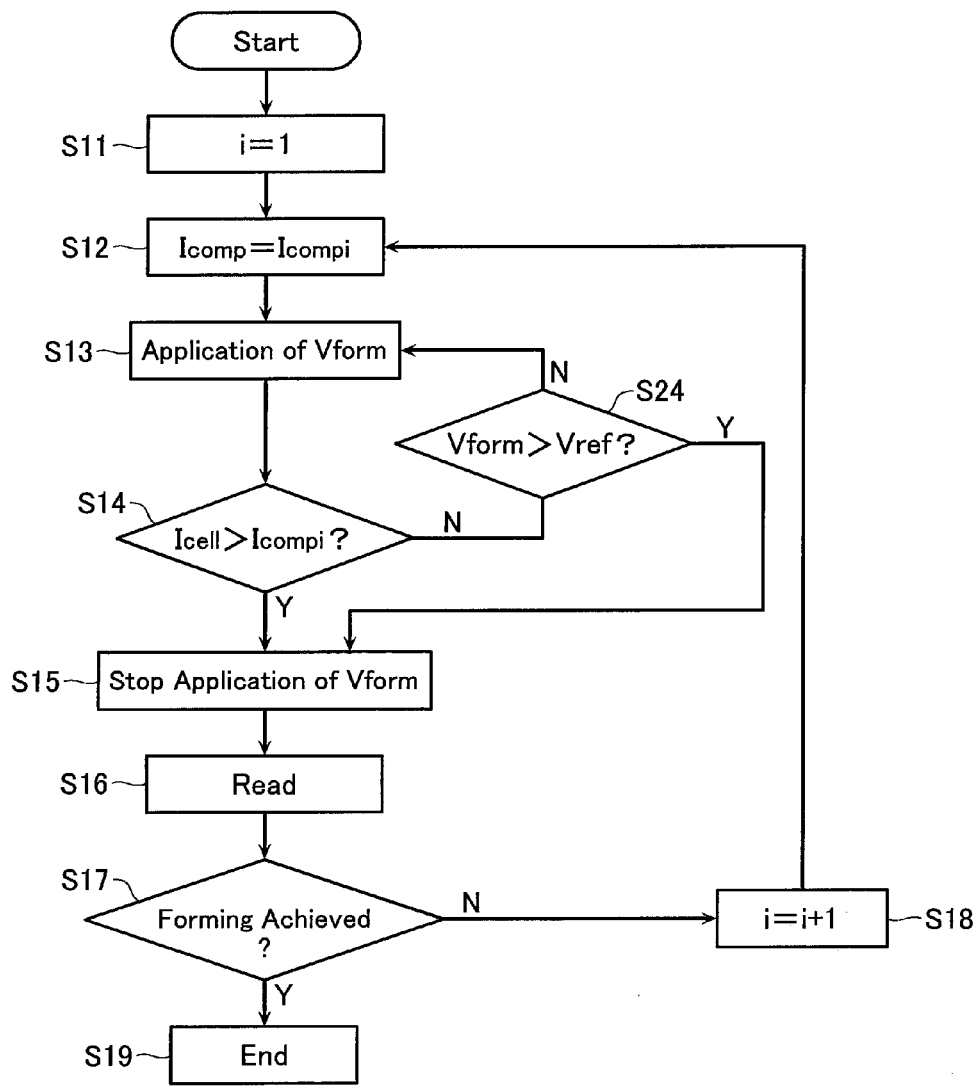
FIG. 12 is a flowchart showing an operation according to the second embodiment of the present invention.

Next, the second embodiment of the present invention will be explained with reference to FIG. 11. The overall configuration of the device is the same as shown in FIG. 1 to FIG. 7 and hence will not be explained in detail. The second embodiment is different from the first embodiment in the procedure of the forming operation. The specific procedure of the forming operation will be explained with reference to the graph of FIG. 11 and the flowchart of FIG. 12. In FIG. 12, the same steps as in the first embodiment are denoted by the same reference numerals and hence will not be explained in detail below.

In the first embodiment, an example has been explained in which the voltage Vform is raised until the cell current Icell reaches the limit current Icompi, and until which the limit current Icompi is kept at a constant value. On the other hand, according to the second embodiment, as shown at step S24 of the flowchart of FIG. 12, when the voltage Vform reaches its upper limit value Vref, and even if this happens before the cell current Icell reaches the limit current Icompi, application of the voltage Vform is once stopped (step S15), the limit current Icomp is stepped up (steps S18, S19), and after this, application of the voltage Vform is started again. According to this operation procedure, the memory cell MC is prevented from being applied an excessive voltage during the forming operation, and the possibility of memory cell destruction can become lower than according to the first embodiment.

[Third Embodiment]

Figure 13:
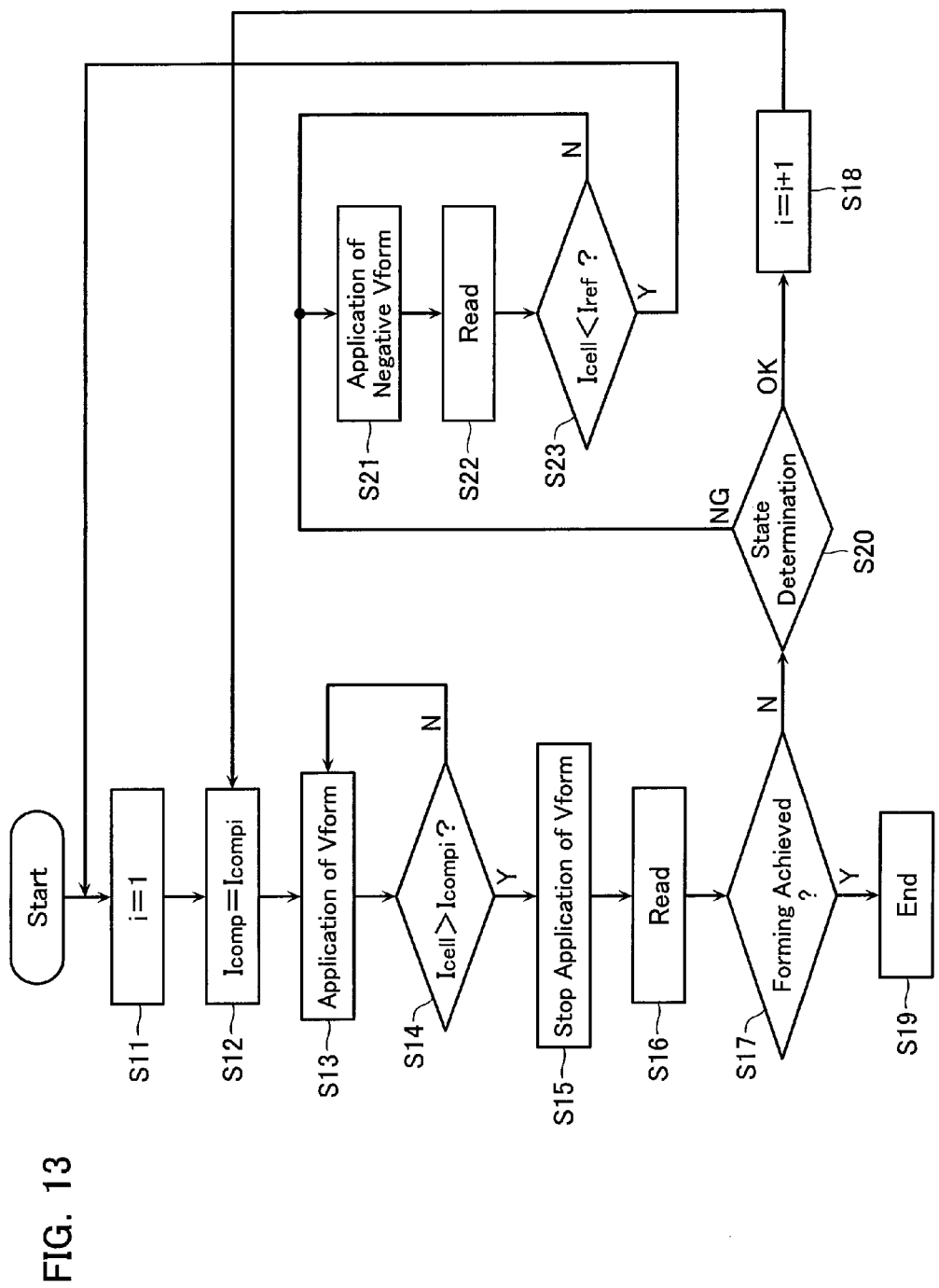
FIG. 13 is a flowchart showing an operation according to a third embodiment of the present invention.

Next, the third embodiment of the present invention will be explained with reference to FIG. 13. The overall configuration of the device is the same as shown in FIG. 1 to FIG. 7 and hence will not be explained in detail. The present embodiment is different from the first embodiment in applying, during a forming operation, a forming voltage Vform having a negative polarity, which is opposite to the polarity of the normal forming voltage Vform, to any memory cell that is determined to be in a certain state. That is, when it is determined in step S17 that the forming of a given memory cell MC has not been achieved and it is determined in step S20 that it is difficult to achieve the forming of that given memory cell MC within a certain period or that it is difficult for the memory cell MC to satisfy a certain characteristic within a certain period, a negative forming voltage Vform is applied to that memory cell MC (step S21). After this, reading is executed in the memory cell MC (step S22). Steps S21 and S22 are repeated until it is determined as a result of the voltage application that the resistance value of the memory cell MC has risen to a certain value (i.e., the cell current Icell has become lower than a certain reference current Iref). When the memory cell MC has become higher in resistance in this way, the flow returns to step S11 and the forming operation is repeated in the same way as in the first embodiment. According to the present embodiment, it becomes possible to reduce the number of memory cells to be handled as defective cells as having failed in forming, and hence to improve the yield ratio of memory cells.

[Fourth Embodiment]

Figure 14:
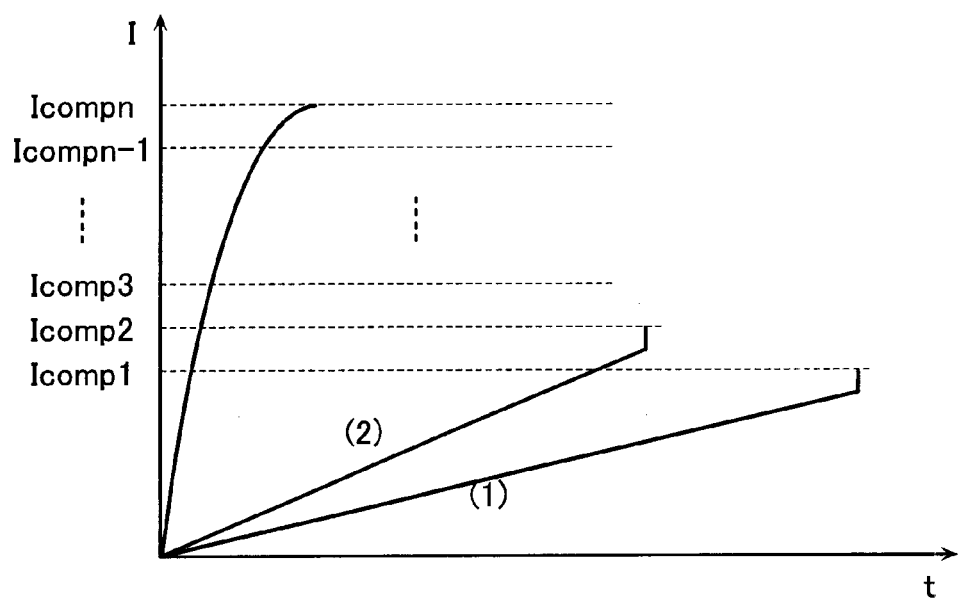
FIG. 14 is a graph showing an operation according to a fourth embodiment of the present invention.

Next, the fourth embodiment of the present invention will be explained with reference to FIG. 14, FIG. 15, and FIG. 16. The overall configuration of the device is the same as shown in FIG. 1 to FIG. 7 and hence will not be explained in detail. The fourth embodiment is different from the first embodiment in the procedure of the forming operation. The specific procedure of the forming operation will be explained with reference to the graphs of FIG. 14 and FIG. 15 and the flowchart of FIG. 16.

Figure 15:
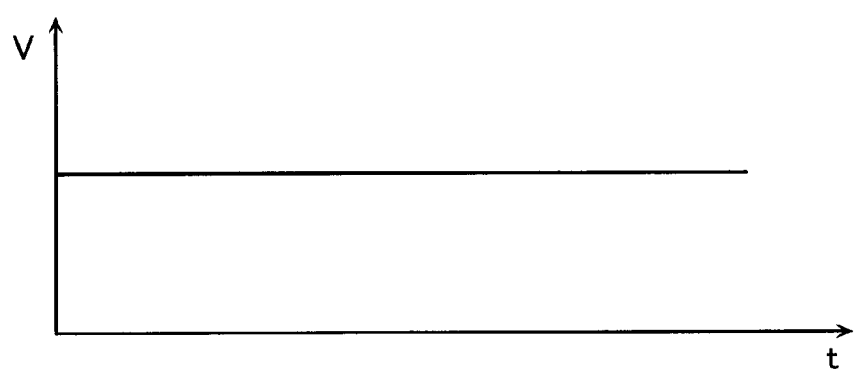
FIG. 15 is a graph showing an operation according to the fourth embodiment of the present invention.
Figure 16:
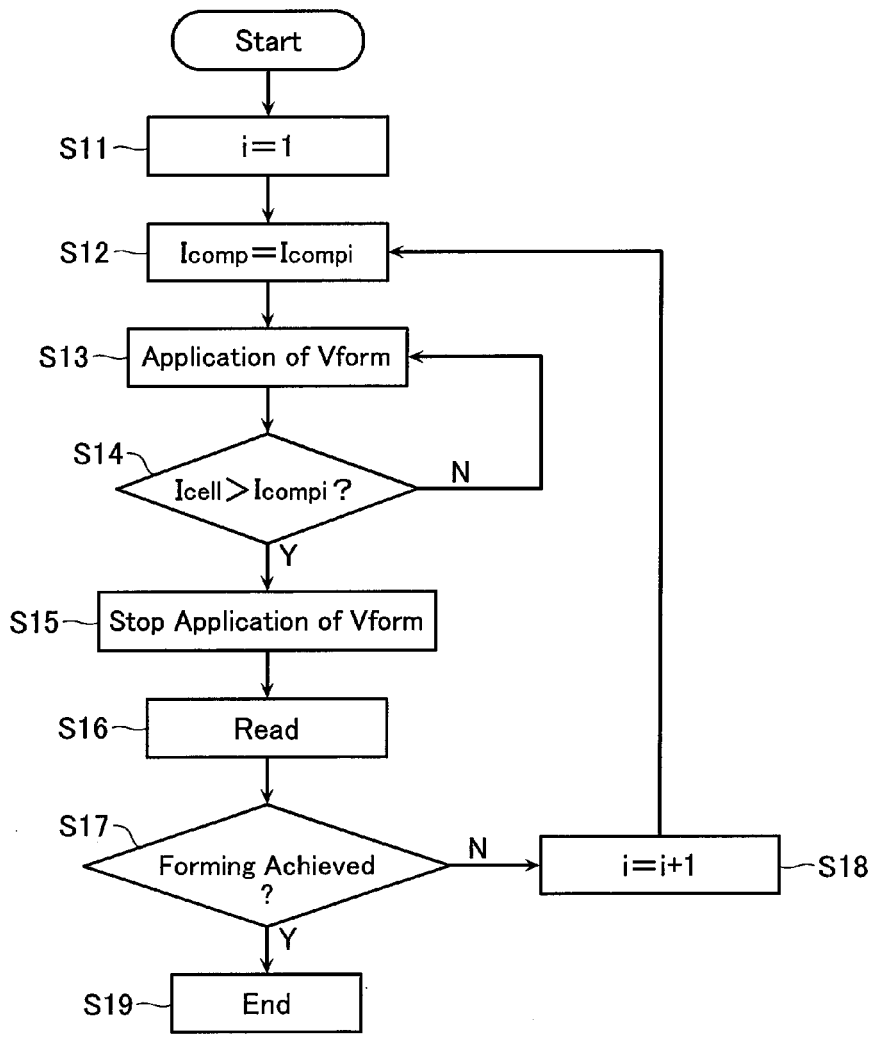
FIG. 16 is a flowchart showing an operation according to the fourth embodiment of the present invention.

The present embodiment is different from the embodiments described above in applying as the voltage for the forming operation, a voltage Vform that is constant irrespective of elapse of time as shown in FIG. 15. This voltage continues to be applied until it is detected that the cell current Icell has reached the limit current Icomp. When it is detected that the cell current Icell has reached the limit current Icomp, application of the voltage Vform is once stopped (step S15 of FIG. 16), and after this, as in the first embodiment, the operation of stepping up the limit current Icomp and the operation of applying the voltage Vform are repeated until the forming is achieved.

[Fifth Embodiment]

Figure 17:
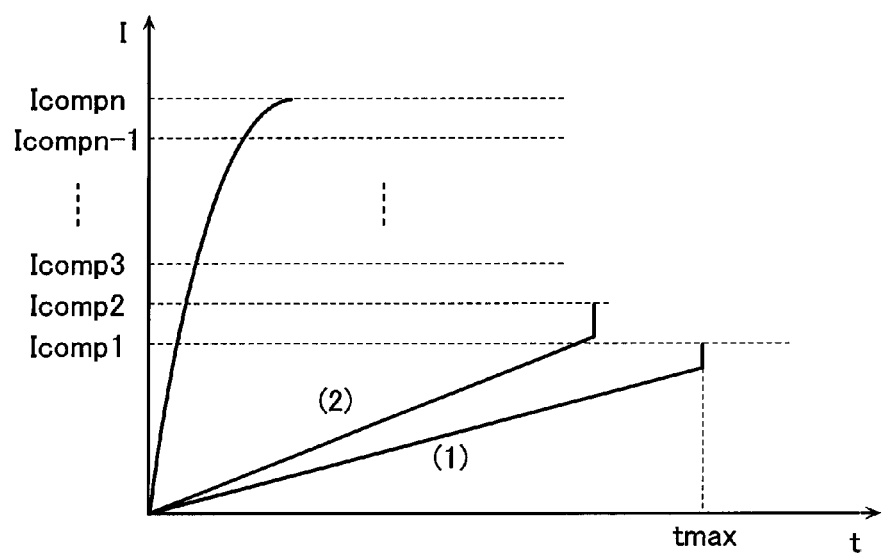
FIG. 17 is a graph showing an operation according to a fifth embodiment of the present invention.
Figure 18:
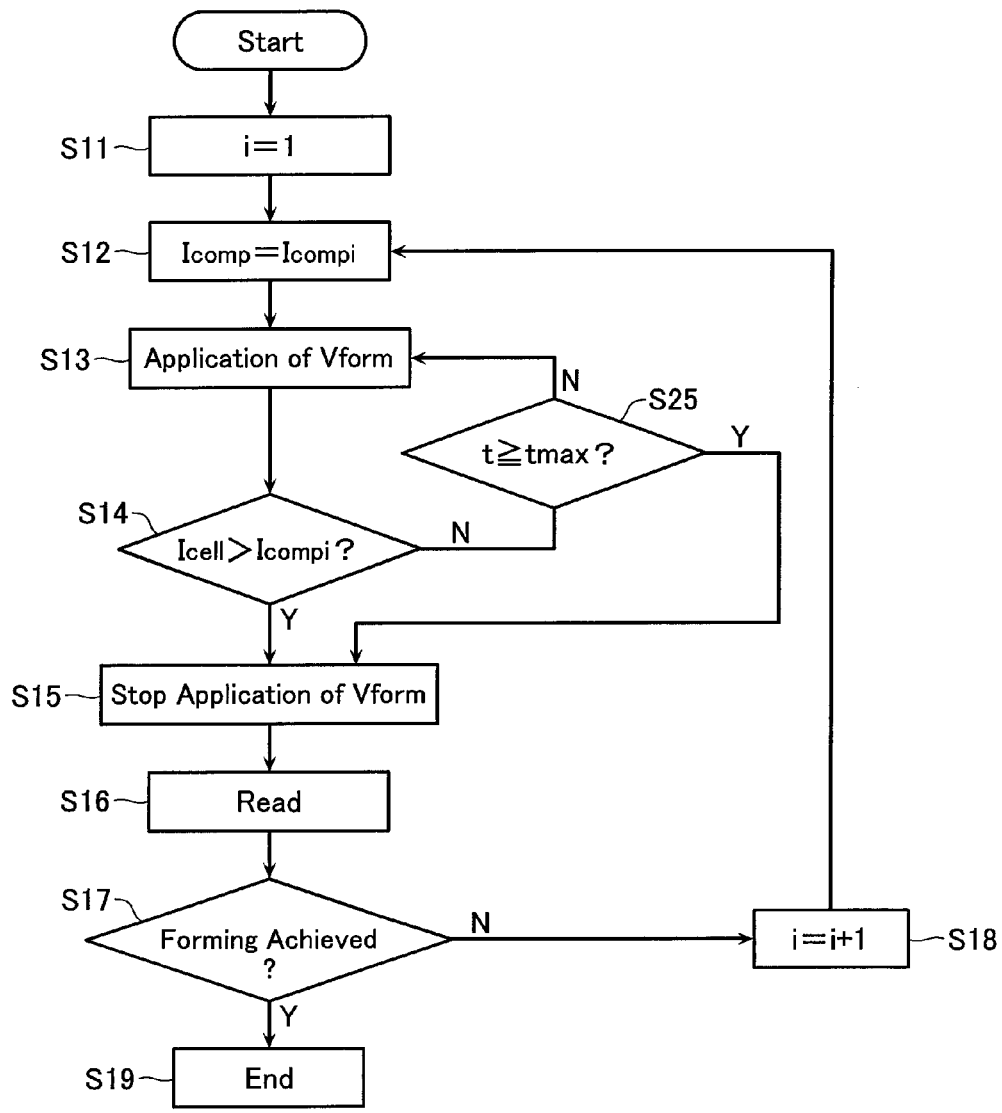
FIG. 18 is a flowchart showing an operation according to the fifth embodiment of the present invention.

Next, the fifth embodiment of the present invention will be explained with reference to FIG. 17 and FIG. 18. The overall configuration of the device is the same as shown in FIG. 1 to FIG. 7 and hence will not be explained in detail. The fifth embodiment is the same as the fourth embodiment in applying as the voltage for the forming operation, a voltage Vform that is constant irrespective of elapse of time as shown in FIG. 15.

However, in the present embodiment, the maximum time Tmax for which the voltage Vform is applied is set, and when the voltage application time t exceeds the maximum time Tmax (step S25 of FIG. 18), application of the voltage Vform is stopped (step S15), and after this, the operation of stepping up the limit current Icomp is executed. The other respects are the same as in the fourth embodiment.

[Sixth Embodiment]

Next, the sixth embodiment of the present invention will be explained with reference to FIG. 19. The overall configuration of the device is the same as shown in FIG. 1 to FIG. 7 and hence will not be explained in detail. The sixth embodiment is different from the first embodiment in the procedure of the forming operation.

Figure 19:
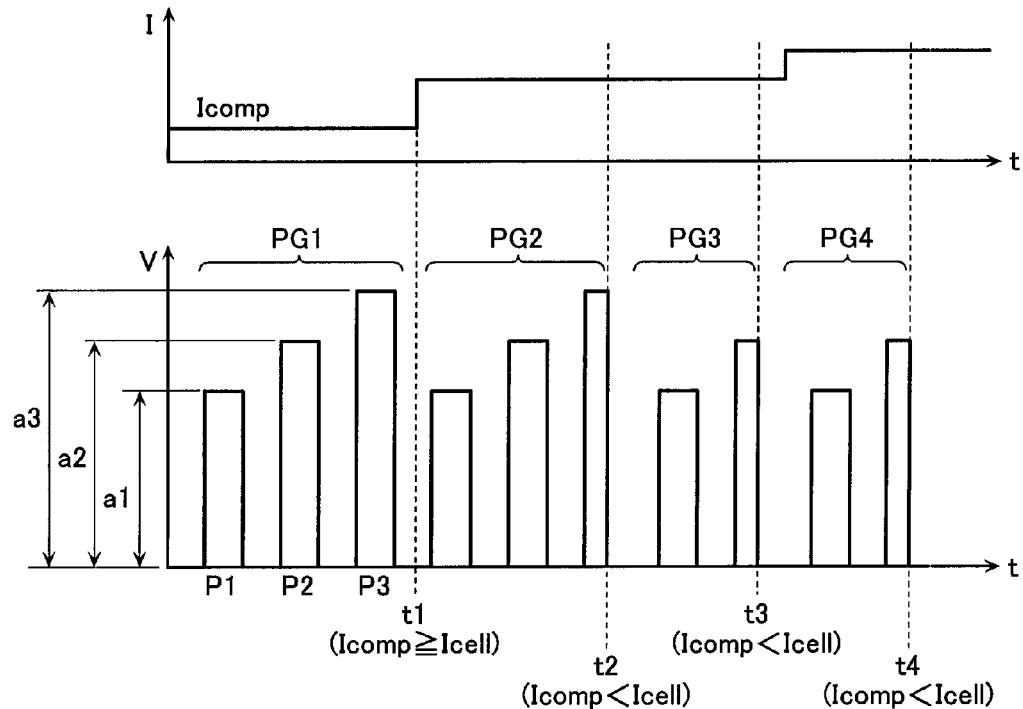
FIG. 19 is a graph showing an operation according to a sixth embodiment of the present invention.

In the present embodiment, the forming voltage Vform is applied as pulse voltages as shown in FIG. 19. In addition, the pulse voltages are applied in the form of pulse groups PGi (i=1, 2, 3, . . . ) each including a plurality of (three in FIG. 19)

pulses P1 to P3. One pulse group PGi is controlled such that later pulse voltages have greater amplitudes a (a1<a2<a3).

If the cell current Icell has not reached the limit current Icomp when application of one pulse group PGi is completed, the limit current Icomp is stepped up and application of the next pulse group PGi+1 is started.

To the contrary, if it is detected in the middle of application of one pulse group PGi that the cell current Icell has reached the limit current Icomp, application of that pulse group PGi is stopped. After this, the limit current Icomp is stepped up and application of the next pulse group PGi+1 is started. Afterwards, application of a pulse group PGi and stepping up of the limit current Icomp are repeated, and when the cell current Icell has reached a certain value, the forming operation is completed.

[Seventh Embodiment]

Figure 20:
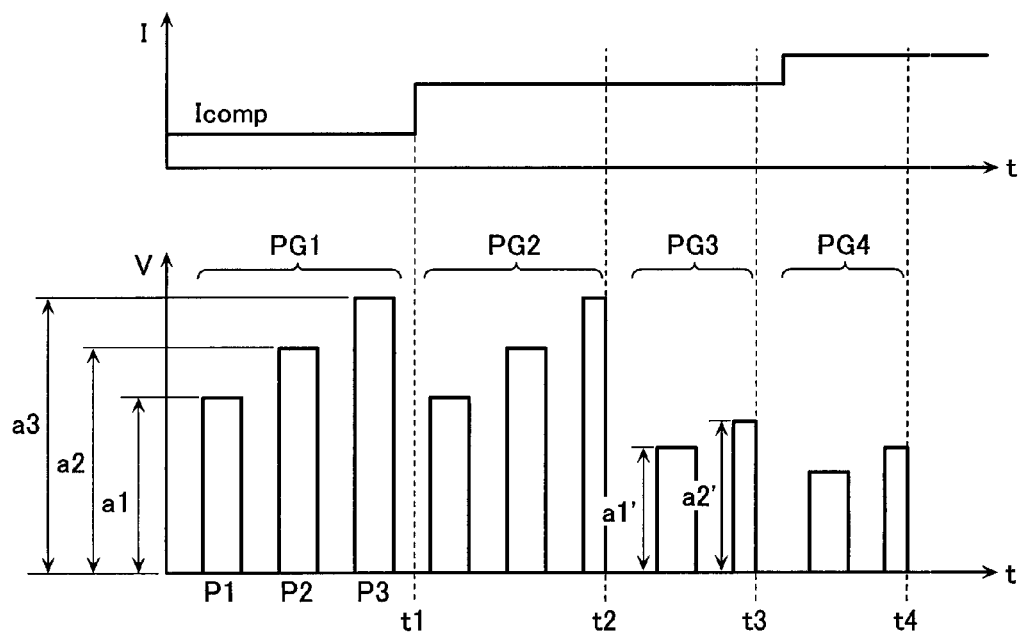
FIG. 20 is a graph showing an operation according to a seventh embodiment of the present invention.

The seventh embodiment of the present invention will now be explained with reference to FIG. 20. The overall configuration of the device is the same as shown in FIG. 1 to FIG. 7 and hence will not be explained in detail. Also in the present embodiment, the forming voltage Vform is applied as pulse voltages as in the sixth embodiment. Only the difference from the sixth embodiment will be explained below.

According to the seventh embodiment, if it is detected in the middle of application of a pulse group PGi that the cell current Icell has reached the limit current Icomp, the amplitudes of the pulse voltages of the pulse group PGi+1 to be applied next and of the following pulse groups PGj (j≥i+2) are reduced from the amplitudes in the pulse group PGi (a1'<a1, a2'<a2). The other respects are the same as in the sixth embodiment.

[Eighth Embodiment]

Figure 21:
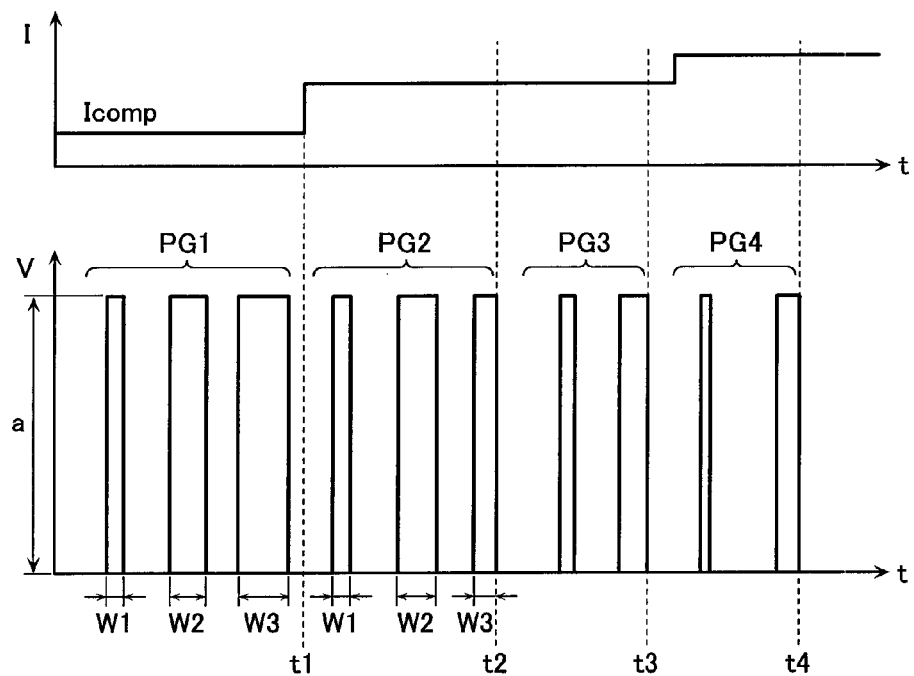
FIG. 21 is a graph showing an operation according to an eighth embodiment of the present invention.

Next, the eighth embodiment of the present invention will be explained with reference to FIG. 21. The overall configuration of the device is the same as shown in FIG. 1 to FIG. 7 and hence will not be explained in detail. Also in the present embodiment, the forming voltage Vform is applied as pulse voltages as in the sixth embodiment. Only the difference from the sixth embodiment will be explained below.

According to the eighth embodiment, all of a plurality of pulse voltages included in one pulse group PGi have the same pulse amplitude a. On the other hand, the plurality of pulse voltages included in one pulse group PGi have different pulse widths W, and later pulse voltages have greater pulse widths (W1<W2<W3). The other respects are the same as in the sixth embodiment. Not only the pulse width W but also the pulse amplitude may be varied.

[Ninth Embodiment]

Figure 22:
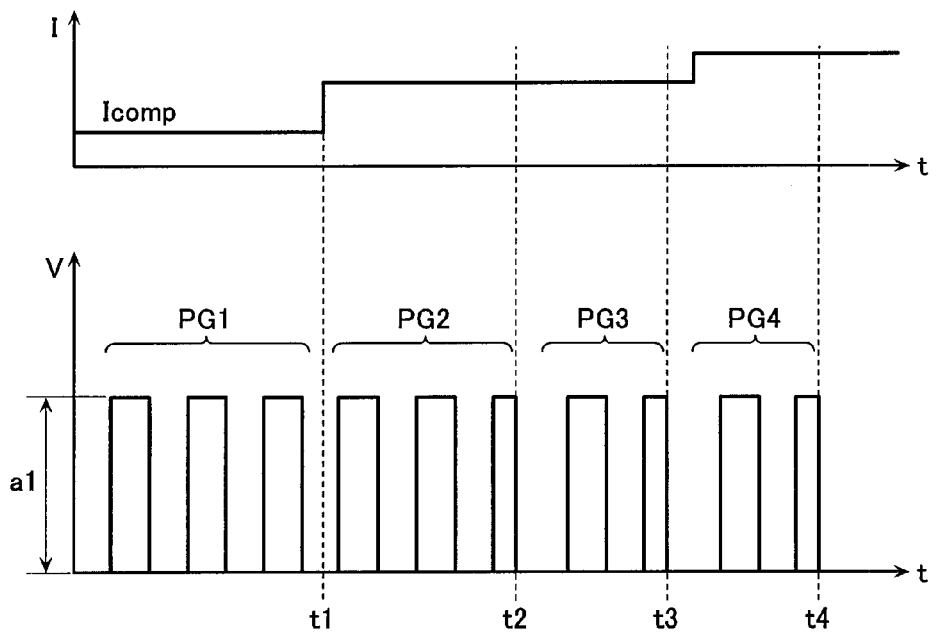
FIG. 22 is a graph showing an operation according to a ninth embodiment of the present invention.

Next, the ninth embodiment of the present invention will be explained with reference to FIG. 22. The overall configuration of the device is the same as shown in FIG. 1 to FIG. 7 and hence will not be explained in detail. Also in the present embodiment, the forming voltage Vform is applied as pulse voltages as in the sixth embodiment. Only the difference from the sixth embodiment will be explained below.

According to the ninth embodiment, all of a plurality of pulse voltages included in one pulse group PGi have the same pulse amplitude a1 and the same pulse width W. Also according to the present embodiment, along with repetition of pulse voltage application, the forming operation can be gradually progressed and completed.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, though the above embodiments have been explained by taking for example the operation of stepping up (incrementing) the limit current Icomp after applying the voltage for the forming operation, the present invention is not limited to this. As the case may be, it is possible not to change the value of the limit current Icomp but to keep it at the same value, or conversely to decrement (step down) the limit current Icomp from the original value. In short, any scheme that includes an operation of changing the value of the limit current Icomp is included in the scope of the present invention, regardless of whether to increment or decrement the value of the limit current Icomp from the original value or to keep it at the same value.

What is claimed is:

1. A nonvolatile semiconductor memory device, comprising:
   a memory cell array including memory cells arranged therein, each of the memory cells being provided between a first line and a second line and including a variable resistor;
   a control circuit configured to apply through the first and second lines a voltage necessary for a forming operation of a memory cell; and
   a current limiting circuit configured to limit a value of a current flowing across the memory cell during the forming operation to a current limit value,
   wherein
      the control circuit is configured to repeat an operation of applying the voltage while setting the current limit value to a certain value and an operation of changing the current limit value when the current flowing across the memory cell during the forming operation has reached the current limit value,
      when the voltage for the forming operation has reached a voltage upper limit value, the control circuit executes an operation of stopping application of the voltage for the forming operation and changing the current limit value, and
      after stopping application of the voltage for the forming operation, the control circuit executes a reading operation in the memory cell, and when a resistance value of the memory cell is higher than a first value, executes an operation of changing the current limit value, whereas when the resistance value of the memory cell is equal to or lower than the first value, completes the forming operation.

2. The nonvolatile semiconductor memory device according to claim 1, wherein the control circuit sets an initial value of the current limit value to a value insufficient for forming of the memory cell to be achieved.

3. The nonvolatile semiconductor memory device according to claim 1, wherein the control circuit executes an operation of changing a resistance value of the memory cell to a second value or higher by applying to the memory cell a voltage having an opposite polarity to that of the voltage for the forming operation.

4. The nonvolatile semiconductor memory device according to claim 1, wherein during the forming operation, the control circuit keeps a voltage to be applied between the first line and the second line constant irrespective of elapse of time, until the value of the current flowing across the memory cell reaches the current limit value.

5. The nonvolatile semiconductor memory device according to claim 4, wherein the control circuit sets an initial value of the current limit value to a value insufficient for forming of the memory cell to be achieved.

6. A nonvolatile semiconductor memory device, comprising:
- a memory cell array including memory cells arranged therein, each of the memory cells being provided between a first line and a second line and including a variable resistor; and
- a control circuit configured to apply a voltage to a memory cell through the first and second lines, during a forming operation, the control circuit being configured to repeat an operation of applying a voltage to the memory cell while limiting a value of a current flowing across the memory cell to a current limit value and an operation of changing the current limit value when the current flowing across the memory cell during the forming operation has reached the current limit value, wherein
- when the voltage for the forming operation has reached a voltage upper limit value, the control circuit executes an operation of stopping application of the voltage for the forming operation and changing the current limit value, and
- after stopping application of the voltage for the forming operation, the control circuit executes a reading operation in the memory cell, and when a resistance value of the memory cell is higher than a first value, executes an operation of changing the current limit value, whereas when the resistance value of the memory cell is equal to or lower than the first value, completes the forming operation.

7. The nonvolatile semiconductor memory device according to claim 6, wherein the control circuit sets an initial value of the current limit value to a value insufficient for forming of the memory cell to be achieved.

8. The nonvolatile semiconductor memory device according to claim 6, wherein the control circuit executes an operation of changing a resistance value of the memory cell to a second value or higher by applying to the memory cell a voltage having an opposite polarity to that of a voltage for the forming operation.

9. A method of forming a nonvolatile semiconductor memory device including memory cells each provided between a first line and a second line and each configured by series connection of a variable resistor and a rectifying element, the method comprising:
- limiting a value of a current flowing across a memory cell during a forming operation to a current limit value;
- applying a voltage for the forming operation by setting the limit value to the current a value; and
- applying the voltage for the forming operation again by changing the current limit value when the current flowing across the memory cell during the forming operation has reached the current limit value, wherein
- when the voltage for the forming operation has reached a voltage upper limit value, an operation of stopping application of the voltage for the forming operation and changing the current limit value are executed,
- after stopping application of the voltage for the forming operation, a reading operation in the memory cell is executed, and when a resistance value of the memory cell is higher than a first value, an operation of changing the current limit value is executed, and
- when the resistance value of the memory cell is equal to or lower than the first value, the forming operation is completed.

10. The method according to claim 9, wherein an initial value of the current limit value is set to a value insufficient for forming of the memory cell to be achieved.

* * * * *